(12) United States Patent  
Arifuku et al.

(10) Patent No.: US 8,497,431 B2
(45) Date of Patent: Jul. 30, 2013

(54) CIRCUIT CONNECTION MATERIAL, CIRCUIT MEMBER CONNECTING STRUCTURE AND METHOD OF CONNECTING CIRCUIT MEMBER

(75) Inventors: Motohiro Arifuku, Chikusei (JP); Nichiomi Mochizuki, Chikusei (JP); Takashi Nakazawa, Chikusei (JP); Kouji Kobayashi, Chikusei (JP); Tohru Fujinawa, Chikusei (JP); Takashi Tatsuzawa, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 779 days.

(21) Appl. No.: 12/374,628

(22) PCT Filed: Jul. 21, 2006

(86) PCT No.: PCT/JP2006/314475
§ 371 (c)(1),
(2), (4) Date: Dec. 14, 2009

(87) PCT Pub. No.: WO2008/010294
PCT Pub. Date: Jan. 24, 2008

(65) Prior Publication Data
US 2010/0108365 A1    May 6, 2010

(51) Int. Cl.
*H05K 3/36* (2006.01)
*H05K 1/09* (2006.01)
*C08F 2/46* (2006.01)

(52) U.S. Cl.
USPC ............. 174/257; 522/173; 522/171; 29/830; 524/494

(58) Field of Classification Search
USPC .................. 174/257; 524/196, 494; 522/104, 522/173, 171, 96, 65; 252/500; 29/830; 528/44
See application file for complete search history.

(56) References Cited

U.S. PATENT DOCUMENTS

| 3,994,764 | A |   | 11/1976 | Wolinski |
| 4,435,537 | A | * | 3/1984 | Horn et al. .................... 524/391 |
| 5,037,715 | A |   | 8/1991 | Hagiwara et al. |
| 6,039,896 | A | * | 3/2000 | Miyamoto et al. ........... 252/511 |
| 6,762,249 | B1 |   | 7/2004 | Fujinawa et al. |
| 6,906,541 | B2 | * | 6/2005 | Kimura ....................... 324/763.01 |
| 7,141,645 | B2 |   | 11/2006 | Fujinawa et al. |

(Continued)

FOREIGN PATENT DOCUMENTS

| CN | 1375179 A | 10/2002 |
| CN | 1425192 A | 6/2003 |

(Continued)

OTHER PUBLICATIONS

Office Action issued on Jul. 19, 2011 in a counterpart Chinese application 201001222542 (no translation available; submitted for certification purposes).

(Continued)

*Primary Examiner* — Angel R Estrada
*Assistant Examiner* — Dimary Lopez
(74) *Attorney, Agent, or Firm* — Griffin & Szipl, P.C.

(57) ABSTRACT

The circuit-connecting material for connection between circuit members each having a board and a circuit electrode formed on the primary surface of the board, comprising an adhesive composition that cures in response to light or heat and an organic compound containing a urethane group and an ester group.

20 Claims, 3 Drawing Sheets

U.S. PATENT DOCUMENTS

| | | | |
|---|---|---|---|
| 7,208,105 B2 | 4/2007 | Nomura et al. | |
| 7,371,452 B2* | 5/2008 | Bourdelais et al. | 428/188 |
| 7,535,462 B2* | 5/2009 | Spath et al. | 345/174 |
| 7,612,151 B2* | 11/2009 | Minamida et al. | 525/453 |
| 2003/0141014 A1 | 7/2003 | Satoyuki et al. | |
| 2004/0012383 A1 | 1/2004 | Kimura | |
| 2004/0213962 A1 | 10/2004 | Bourdelais et al. | |
| 2004/0214979 A1 | 10/2004 | Fujinawa et al. | |
| 2004/0222408 A1 | 11/2004 | Watanabe et al. | |
| 2005/0151271 A1 | 7/2005 | Tatsuzawa et al. | |
| 2005/0176882 A1 | 8/2005 | Arifuku et al. | |
| 2006/0014860 A1 | 1/2006 | Watanabe et al. | |
| 2006/0252843 A1 | 11/2006 | Fujinawa et al. | |
| 2007/0055039 A1* | 3/2007 | Usui et al. | 528/123 |
| 2007/0166549 A1 | 7/2007 | Nomura et al. | |
| 2007/0232764 A1 | 10/2007 | Minamida et al. | |
| 2010/0265685 A1 | 10/2010 | Fujinawa et al. | |
| 2010/0294551 A1 | 11/2010 | Nomura et al. | |

FOREIGN PATENT DOCUMENTS

| | | |
|---|---|---|
| CN | 1737075 A | 2/2006 |
| EP | 0 979 854 A1 | 2/2000 |
| EP | 1 223 795 A1 | 7/2002 |
| EP | 1 229 095 A1 | 8/2002 |
| EP | 1 734 095 A1 | 12/2006 |
| GB | 2 019 415 A1 | 10/1979 |
| JP | 61-047760 | 3/1986 |
| JP | 1-135639 | 5/1989 |
| JP | 03-110711 | 5/1991 |
| JP | 6-52715 | 2/1994 |
| JP | 07-076185 | 3/1995 |
| JP | 11-110747 | 4/1999 |
| JP | 2000-239642 | 9/2000 |
| JP | 2001-055555 | 2/2001 |
| JP | 2002-111213 | 4/2002 |
| JP | 2003 223812 A1 | 8/2003 |
| JP | 2003-313533 | 11/2003 |
| JP | 2004-001486 | 1/2004 |
| JP | 2004-136673 | 5/2004 |
| JP | 2005 060489 A | 3/2005 |
| JP | 2005-290394 | 10/2005 |
| JP | 2005-307210 | 11/2005 |
| JP | 2005-322938 | 11/2005 |
| JP | 2006-52258 | 6/2006 |
| JP | 2006-318990 | 11/2006 |
| JP | 2006-318990 A | 11/2006 |
| JP | 2008-290327 A | 12/2008 |
| KR | 2003-0037017 | 5/2003 |
| TW | 480278 | 3/2002 |
| TW | 200538526 | 12/2005 |
| WO | 92/22192 | 12/1992 |
| WO | 98/44067 | 10/1998 |
| WO | 01/15505 A1 | 3/2001 |
| WO | 03/087246 A1 | 10/2003 |
| WO | 2005/035617 A1 | 4/2005 |
| WO | 2005/097933 A1 | 10/2005 |
| WO | 2008/010294 A | 1/2008 |

OTHER PUBLICATIONS

Supplementary European Search report issued in a counterpart European Application 06768353.2, completed Mar. 29, 2010 and mailed Apr. 8, 2010.

Office Action issued in a counterpart Malaysian application PI20063753 on Jun. 15, 2010.

Office Action issued in a related Japanese application 2010-015598 on Sep. 13, 2011 (no translation available; submitted for certification purposes).

Office Action issued in corresponding Japanese patent application 2008-525772 on Nov. 1, 2011 (no translation available; submitted for certification).

International Search Report issued in corresponding application No. PCT/JP2006/314475, completed Oct. 10, 2006 and mailed Oct. 17, 2006.

Search Report and Written Opinion issued in a counterpart application in Singapore dated Mar. 8, 2010.

Search Report issued in a counterpart European application 11189685.8 completed Feb. 29, 2012 and mailed Mar. 13, 2012.

Office Action issued in Chinese patent application No. 20101012254.2, dated Jan. 18, 2011 citing Foreign Patent Document 1 above (no translation available; submitted for certification purposes only).

Search Report issued in European application 10156276.7, completed Jan. 25, 2011 and mailed Feb. 1, 2011, citing Foreign Patent Documents 2 and 3; US Patent Publication Documents 1-3.

Office Action issued in Japanese Patent Application No. 2005-137627, dated Mar. 1, 2011, citing Foreign Patent Documents 4-7 above (no translation available; submitted for certification purposes only).

Office Action issued in Chinese patent application No. 201010122253.8, dated May 25, 2011; no translation available—submitted for certification purposes.

Office Action issued in Japanese patent application No. P2010-015598, dated Jun. 21, 2011; no translation available—submitted for certification purposes.

Office Action issued in a related Japanese application No. 2005-137627 on Jul. 13, 2010.

Office Action issued in a related Japanese patent application No. P2005-137627, dated Jun. 21, 2011; no translation available—submitted for certification purposes.

Extended European Search Report issued in a counterpart application 10156277.5, completed Oct. 12, 2010 and mailed Oct. 20, 2010.

* cited by examiner

CIRCUIT CONNECTION MATERIAL, CIRCUIT MEMBER CONNECTING STRUCTURE AND METHOD OF CONNECTING CIRCUIT MEMBER

This is a National Phase Application in the United States of International Patent Application No. PCT/JP2006/314475 filed Jul. 21, 2006, which does not claim foreign priority under 35 U.S.C. §119 on Japanese Patent Application No. P2005-137627, filed May 10, 2005. The entire disclosures of the above patent applications are, however, hereby incorporated by reference.

TECHNICAL FIELD

The present invention relates to a circuit-connecting material, a circuit member connection structure and a circuit member connection method for connection of circuit members bearing circuit electrodes.

BACKGROUND ART

Increasing densification of circuits used in the field of precision electronic devices in recent years, leading to extremely narrow electrode widths and electrode spacing, is a cause of more frequent flaking, peeling and shifting of wirings. In order to solve this problem, electrical and electronic circuit-connecting materials with excellent low-temperature fast-curing properties and adequately long usable life have been developed (for example, see International Patent Publication No. 98/44067 and International Patent Publication No. 01/015505).

DISCLOSURE OF THE INVENTION

Conventional circuit-connecting members, however, do not always exhibit adequate bonding strength depending on the type of material used to form the connecting circuit member. In particular, significant bonding strength reduction has been a problem with circuit electrode-supporting boards formed of polyethylene terephthalate, polyimide resins, polyethersulfone, acrylic resins and glass, or circuit member surfaces formed of layers made of silicone resins, polyimide resins and acrylic resins.

It is therefore an object of the present invention to provide a circuit-connecting material that can yield sufficient bonding strength for connection of circuit members having boards formed of polyethylene terephthalate, polyimide resins, polyethersulfone, acrylic resins or glass, or circuit members having surfaces formed of layers made of silicone resins, polyimide resins or acrylic resins.

In order to achieve this object, the circuit-connecting material of the invention is a circuit-connecting material for connection between a circuit member having a board and a circuit electrode formed on the primary surface of the board, the material comprising an adhesive composition that cures under light or heat and an organic compound containing a urethane group and an ester group.

Since the circuit-connecting material of the invention comprises both an adhesive composition and an organic compound containing a urethane group and an ester group, sufficient adhesive strength is obtained for connection of circuit members having boards formed of polyethylene terephthalate, polyimide resins, polyethersulfone, acrylic resins or glass, or circuit members having surfaces formed of layers made of silicone resins, polyimide resins or acrylic resins.

The adhesive composition is preferably one containing a radical polymerizing compound and a radical initiator that generates radicals in response to heat or light. In this case, the radical polymerizing compound is more preferably one containing a phosphoric acid ester compound with an acrylate group or methacrylate group from the standpoint of further improving bonding strength with inorganic material surfaces such as metals.

The glass transition temperature of the organic compound is preferably 50° C. or higher. If the organic compound has both a urethane group and an ester group and the glass transition temperature is 50° C. or higher, the bonding strength will be even greater especially after high-temperature and high-humidity testing. If the organic compound has either a urethane group or an ester group, and the glass transition temperature is 50° C. or higher, reduction in the bonding strength in high-temperature and high-humidity environments can be prevented, but the initial bonding strength may not be sufficient. In contrast, the initial bonding strength can be maintained sufficiently high and reduction in the bonding strength in high-temperature and high-humidity environments can be further prevented by a circuit-connecting material using the organic compound containing both a urethane group and an ester group.

The organic compound containing both a urethane group and an ester group preferably contains an aromatic group and/or a cyclic aliphatic group, and preferably has a weight-average molecular weight of 5000 to 100000.

The circuit-connecting material of the invention preferably contains conductive particles. This will maintain an insulated state between circuit electrodes on the same board and allow more stable electrical connection between circuit members.

The circuit member connection structure of the invention comprises a first circuit member with a first board and a first circuit electrode formed on the primary surface of the first board, and a second circuit member with a second board and a second circuit electrode formed on the primary surface of the second board, which are connected by a circuit-connecting member made of a cured product of the aforementioned circuit-connecting material of the invention, formed between the first and second circuit members, in such a manner that the first circuit electrode and second circuit electrode are opposing each other and electrically connected.

The circuit member connection method of the invention is a method whereby a first circuit member with a first board and a first circuit electrode formed on the primary surface of the first board, a layer made of the aforementioned circuit-connecting material of the invention, and a second circuit member with a second board and a second circuit electrode formed on the primary surface of the second board, are heated and pressed as a laminate prepared by laminating them in that order with the first circuit electrode and second circuit electrode opposing each other, to connect the first circuit member and the second circuit member in such a manner that the first circuit electrode and second circuit electrode are electrically connected.

A circuit member connection structure of the invention having the circuit members connected by a circuit-connecting material of the invention exhibits high bonding strength between the circuit members and excellent durability under high temperature and high humidity conditions. According to the circuit member connection method of the invention, whereby circuit members are connected by a circuit-connecting material of the invention, it is possible to obtain a circuit member connection structure with high bonding strength between circuit members and excellent durability under high temperature and high humidity conditions.

In the aforementioned circuit member connection structure and circuit member connection method, at least one of the first and second circuit electrodes has a surface made of a material comprising one or more selected from the group consisting of gold, silver, tin, platinum-group metals and indium-tin oxide.

Also, in the aforementioned circuit member connection structure and circuit member connection method, at least one of the first and second boards is a board made of a material comprising one or more selected from the group consisting of polyethylene terephthalate, polyethersulfone, epoxy resins, acrylic resins, polyimide resins and glass. Alternatively, a layer comprising one or more selected from the group consisting of silicone resins, acrylic resins and polyimide resins is preferably formed between at least one of the first and second circuit members and the circuit-connecting member. When the circuit-connecting material of the invention is cured to form a circuit-connecting member, it exhibits high bonding strength with layers composed of these specific materials.

According to the invention, there is provided a circuit-connecting material that yields sufficient bonding strength for connection of circuit members having boards formed of polyethylene terephthalate, polyimide resins, polyethersulfone, acrylic resins or glass, or circuit members with surfaces formed of layers made of silicone resins, polyimide resins or acrylic resins. Also according to the invention, it is easy to achieve both bonding strength and other required properties (in terms of connection resistance, insulating properties, and the like). Also according to the invention, a relatively wide range of selection is available for the material composition to obtain the effect described above.

BEST MODES FOR CARRYING OUT THE INVENTION

Figure 1:
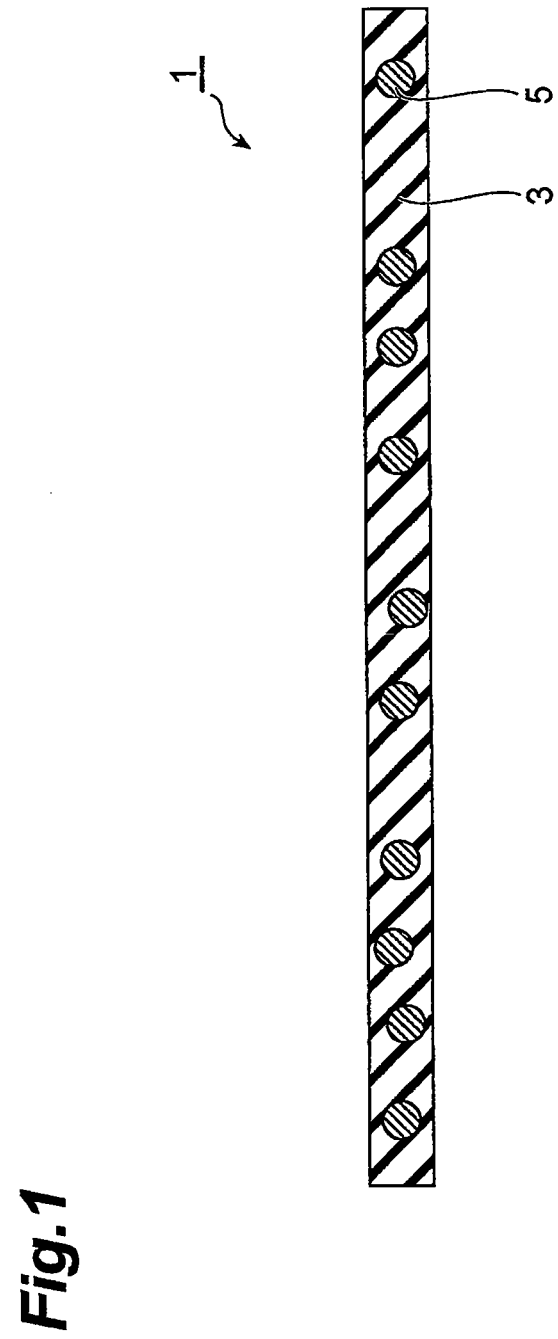
FIG. 1 is a cross-sectional view showing an embodiment of a circuit-connecting material film according to the invention.

Preferred embodiments of the invention will now be explained in detail, with reference to the accompanying drawings where appropriate. However, it is to be understood that the invention is in no way limited to these embodiments.

The circuit-connecting material of the invention contains an adhesive composition that cures in response to light or heat. The adhesive composition is preferably one containing a radical polymerizing compound and a radical initiator that generates radicals in response to heat or light.

A radical polymerizing compound is one having a functional group that polymerizes by active radicals, and for example, acrylic acid ester compounds, methacrylic acid ester compounds and maleimide compounds are suitable for use. A radical photopolymerizing compound may be a polymerizable monomer or a polymerizable oligomer. Because polymerizable oligomers generally have high viscosity, they are preferably used in combination with low-viscosity polymerizable monomers such as polymerizable polyfunctional acrylate monomers in order to adjust the viscosity.

As acrylic acid ester compounds or methacrylic acid ester compounds there may be used polymerizable oligomers such as epoxy (meta)acrylate oligomers, urethane (meta)acrylate oligomers, polyether (meta)acrylate oligomers, polyester (meta)acrylate oligomers and the like, or polymerizable monomers such as acrylic acid esters and methacrylic acid esters.

As acrylic acid esters there may be mentioned monofunctional or polyfunctional acrylate monomers such as trimethylolpropane triacrylate, polyethyleneglycol diacrylate, polyalkyleneglycol diacrylate, pentaerythritol acrylate, 2-cyanoethyl acrylate, cyclohexyl acrylate, dicyclopentenyl acrylate, dicyclopentenyloxyethyl acrylate, 2-(2-ethoxyethoxy)ethyl acrylate, 2-ethoxyethyl acrylate, 2-ethylhexyl acrylate, n-hexyl acrylate, 2-hydroxyethyl acrylate, hydroxypropyl acrylate, isobornyl acrylate, isodecyl acrylate, isooctyl acrylate, n-lauryl acrylate, 2-methoxyethyl acrylate, 2-phenoxyethyl acrylate, tetrahydrofurfuryl acrylate, neopentylglycol diacrylate, dipentaerythritol hexaacrylate and allyl acrylate.

As methacrylic acid esters there may be used the aforementioned acrylic acid esters substituted acrylic group with metacrylic group. Specifically, there may be mentioned monofunctional or polyfunctional methacrylate monomers such as t-butylaminoethyl methacrylate, cyclohexyl methacrylate, dicyclopentenyloxyethyl methacrylate, 2-hydroxyethyl methacrylate, isobornyl methacrylate, isodecyl methacrylate, n-lauryl acrylate, stearyl methacrylate, tridecyl methacrylate, glycidyl methacrylate and allyl methacrylate, as compounds corresponding to the aforementioned acrylic acid esters.

Preferred for use as acrylic acid esters and methacrylic acid esters in addition to those mentioned above are phosphoric acid ester compounds with acrylate groups or methacrylate groups with phosphoric acid ester group. Preferred phosphoric acid ester compounds are, for example, those represented by general formula (I) below. In formula (I), n represents an integer of 1 to 3 and R represents hydrogen or methyl. As specific examples of compounds represented by formula (I) there may be mentioned mono(2-methacryloyloxyethyl) acid phosphate and di(2-methacryloyloxyethyl) acid phosphate. The phosphoric acid ester compound may be synthesized, for example, by reacting phosphoric anhydride with 2-hydroxyethyl acrylate as will be understood by a person skilled in the art.

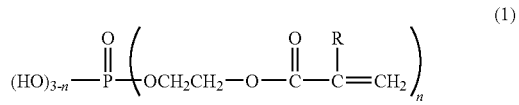

(1)

As maleimide compounds there are preferred those having two or more maleimide groups. As examples of maleimide compounds having two or more maleimide groups there may be mentioned 1-methyl-2,4-bismaleimidebenzene, N,N'-m-phenylenebismaleimide, N,N'-p-phenylenebismaleimide, N,N'-m-toluilenebismaleimide, N,N'-4,4-biphenylenebismaleimide, N,N'-4,4-(3,3'-dimethyl-biphenylene)bismaleimide, N,N'-4,4-(3,3'-dimethyldiphenylmethane)bismaleimide, N,N'-4,4-(3,3'-diethyldiphenylmethane)bismaleimide, N,N'-4,4-diphenylmethanebismaleimide, N,N'-4,4-diphenylpropanebismaleimide, N,N'-4,4-diphenyletherbismaleimide, N,N'-3,3'-diphenylsulfonebismaleimide, 2,2-bis(4-(4-maleimidephenoxy)phenyl)propane, 2,2-bis(3-s-butyl-4-8(4-maleimidephenoxy)phenyl)propane, 1,1-bis(4-(4-maleimidephenoxy)phenyl)decane, 4,4'-cyclohexylidene-bis(1-(4-maleimidephenoxy)-2-cyclohexylbenzene, 2,2-bis(4-(4-maleimidephenoxy)phenyl)hexafluoropropane and the like. These may be used alone or in combinations of two or more.

The aforementioned compounds may be used as radical polymerizing compounds alone or in combinations as necessary. Particularly preferred are urethane acrylate oligomers because they can inhibit cure shrinkage of the circuit-connecting material and impart flexibility to the cured product, while it is more preferred to use urethane acrylate in combination with one or more polymerizable monomers.

As radical initiators that generate radicals in response to heat or light, there may be used compounds such as organic peroxides, azo-based compounds and photoinitiators that generate active radicals by one or more types of treatment involving exposure to heat or light.

Organic peroxides and azo-based compounds primarily generate active radicals in response to heat. When such compounds are used as radical initiators, one or more organic peroxides and/or azo-based compounds are appropriately selected depending on the desired connection temperature, connection time and pot life.

From the standpoint of both high reactivity and sufficient pot life, the organic peroxide preferably has a 10-hr half-life temperature of 40° C. or higher and a 1-min half-life temperature of no higher than 180° C., and more preferably it has a 10-hr half-life temperature of 60° C. or higher and a 1-min half-life temperature of no higher than 170° C. The organic peroxide also preferably has a chlorine ion or organic acid content of no greater than 5000 ppm in order to prevent corrosion of the circuit electrodes (connection terminals) of the circuit members, and more preferably it has low organic acid generation after thermal decomposition.

Specifically, as organic peroxides there may be suitably used diacyl peroxides, dialkyl peroxides, peroxydicarbonates, peroxyesters, peroxyketals, hydroperoxides, say peroxides and the like.

As diacyl peroxides there may be mentioned isobutyl peroxide, 2,4-dichlorobenzoyl peroxide, 3,5,5-trimethylhexanoyl peroxide, octanoyl peroxide, lauroyl peroxide, stearoyl peroxide, succinic peroxide, benzoylperoxytoluene and benzoyl peroxide.

As dialkyl peroxides there may be mentioned α, α'-bis(t-butylperoxy)diisopropylbenzene, dicumyl peroxide, 2,5-dimethyl-2,5-di(t-butylperoxy)hexane and t-butylcumyl peroxide.

As peroxydicarbonates there may be mentioned di-n-propyl peroxydicarbonate, diisopropyl peroxydicarbonate, bis(4-t-butylcyclohexyl) peroxydicarbonate, di-2-ethoxymethoxy peroxydicarbonate, di(2-ethylhexylperoxy) dicarbonate, dimethoxybutyl peroxydicarbonate and di(3-methyl-3-methoxybutylperoxy)dicarbonate.

As peroxyesters there may be mentioned cumyl peroxyneodecanoate, 1,1,3,3-tetramethylbutyl peroxyneodecanoate, 1-cyclohexyl-1-methylethyl peroxyneodecanoate, t-hexylperoxyneodecanoate, t-butyl peroxypivalate, 1,1,3,3-tetramethylbutyl peroxy-2-ethylhexanonate, 2,5-dimethyl-2,5-di(2-ethylhexanoylperoxy)hexane, 1-cyclohexyl-1-methylethyl peroxy-2-ethylhexanonate, t-hexyl peroxy-2-ethylhexanonate, t-butyl peroxy-2-ethylhexanonate, t-butyl peroxyisobutyrate, 1,1-bis(t-butylperoxy)cyclohexane, t-hexyl peroxyisopropylmonocarbonate, t-butyl peroxy-3,5,5-trimethylhexanonate, t-butyl peroxylaurate, 2,5-dimethyl-2,5-di(m-toluoylperoxy)hexane, t-butyl peroxyisopropylmonocarbonate, t-butyl peroxy-2-ethylhexylmonocarbonate, t-hexyl peroxybenzoate, t-butyl peroxyacetate and di(t-butylperoxy) hexahydroterephthalate.

As peroxyketals there may be mentioned 1,1-bis(t-hexylperoxy)-3,3,5-trimethylcyclohexane, 1,1-bis(t-hexylperoxy) cyclohexane, 1,1-bis(t-butylperoxy)-3,3,5-trimethylcyclohexane, 1,1-(t-butylperoxy)cyclododecane and 2,2-bis(t-butylperoxy)decane.

As hydroperoxides there may be mentioned diisopropylbenzene hydroperoxide and cumene hydroperoxide.

As silyl peroxides there may be mentioned t-butyltrimethylsilyl peroxide, bis(t-butyl)dimethylsilyl peroxide, t-butyltrivinylsilyl peroxide, bis(t-butyl)divinylsilyl peroxide, tris(t-butyl)vinylsilyl peroxide, t-butyltriallylsilyl peroxide, bis(t-butyl)diallylsilyl peroxide and tris(t-butyl)allylsilyl peroxide.

These organic peroxides and azo-based compounds may be used alone or in combinations of two or more. They may also be used with triggers, inhibitors and the like. These compounds are preferably microencapsulated by coating with polymer compounds such as polyurethanes or polyesters for a longer usable life.

Examples of photoinitiators that are suitable for use include benzoin ethers such as benzoinethyl ether and isopropylbenzoin ether, benzyl ketals such as benzyl and hydroxycyclohexylphenylketone, ketones such as benzophenone and acetophenone and derivatives thereof, as well as thioxanthones, bisimidazoles and the like.

When a photoinitiator is used, an optimum photoinitiator is preferably selected in consideration of the wavelength of the light source used and the desired curing properties. The photoinitiator may, if necessary, be used with a sensitizing agent such as an amine, sulfur compound or phosphorus compound in a desired proportion.

As sensitizing agents there are preferred aliphatic amines, aromatic amines, cyclic amines with nitrogen-containing cyclic structures such as piperidine, and o-tolylthiourea, sodium diethyldithiophosphate, soluble salts of aromatic sulfinic acids, N,N'-dimethyl-p-aminobenzonitrile, N,N'-diethyl-p-aminobenzonitrile, N,N'-di(β-cyanoethyl)-p-aminobenzonitrile, N,N'-di(β-chloroethyl)-p-aminobenzonitrile, tri-n-butylphosphine, and the like.

Alternatively, there may be used non-pigment sensitizing agents such as propiophenone, acetophenone, xanthone, 4-methylacetophenone, benzophenone, fluorene, triphenylene, biphenyl, thioxanthone, anthraquinone, 4,4'-bis(dimethylamino)benzophenone, 4,4'-bis(diethylamino)benzophenone, phenanthrene, naphthalene, 4-phenylacetophenone, 4-phenylbenzophenone, 1-iodonaphthalene, 2-iodonaphthalene, acenaphthene, 2-naphthonitrile, 1-naphthonitrile, chrysene, benzyl, fluoranthene, pyrene, 1,2-benzoanthracene, acridine, anthracene, perylene, tetracene and 2-methoxynaphthalene, and pigment sensitizing agents such as thionine, methylene blue, lumiflavin, riboflavin, lumichrome, coumarin, psoralen, 8-methoxypsoralen, 6-methylcoumarin, 5-methoxypsoralen, 5-hydroxypsoralen, coumarylpyrone, acridine orange, acriflavin, proflavin, fluorescein, eosin Y, eosin B, erythrosine and rose Bengal.

As radical initiators there may also be mentioned combinations of the aforementioned photoinitiators with compounds that generate radicals in response to heat, such as organic peroxides and azo-based compounds.

The adhesive composition may also contain an epoxy resin and a curing agent thereof. As epoxy resins there may be used epoxy compounds having two or more glycidyl groups in the molecule, either alone or in mixtures of two or more. Specifically, there may be mentioned bisphenol-type epoxy resins derived from epichlorhydrin and bisphenol A, F, AD or the like, epoxy-novolac resins derived from epichlorhydrin and phenol-novolac or cresol-novolac, naphthalate-based epoxy resins having a naphthalene ring-containing skeleton, or glycidylamine-type epoxy resins, biphenyl-type epoxy resins and alicyclic epoxy resins. An epoxy resin preferably is a high-purity product with an impurity ion ($Na^+$, $Cl^-$, etc.) content and hydrolyzable chlorine content reduced to no greater than 300 ppm, in order to prevent electron migration.

The epoxy resin curing agent is preferably a latent curing agent in order to obtain a sufficiently long pot life. There may be mentioned imidazoles, hydrazides, boron trifluoride-amine chelates, sulfonium salts, amineimides, polyamine salts and dicyandiamine, and such curing agents microencapsulated by covering with polyurethane-based or polyester-based polymer substances. These may be used alone or in mixtures, or in combination with triggers, inhibitors and the like.

The circuit-connecting material of the invention comprises a combination of the aforementioned adhesive composition and an organic compound containing a urethane group and an ester group (hereinafter also referred to as "ester urethane compound"). The ester urethane compound preferably has the urethane group and ester group in the main chain.

The ester urethane compound may be obtained, for example, by reaction of a polyester polyol and a diisocyanate. The ester urethane compound obtained by the reaction is often referred to as a "polyester urethane resin".

As diisocyanates there are preferred aromatic, alicyclic or aliphatic diisocyanates such as 2,4-tolylene diisocyanate (TDI), 4,4'-diphenylmethane diisocyanate (MDI), 1,6-hexaamethylene diisocyanate (HDI) and isophorone diisocyanate (IPDI).

A polyester polyol is a polymer containing multiple ester groups and multiple hydroxyl groups. A polyester polyol may be obtained, for example, by reaction between a dicarboxylic acid and a diol. As dicarboxylic acids there are preferred aromatic and aliphatic dicarboxylic acids such as terephthalic acid, isophthalic acid, adipic acid and sebacic acid. As diols there are preferred glycols such as ethylene glycol, propylene glycol, 1,4-butanediol, hexanediol, neopentyl glycol, diethylene glycol and triethylene glycol.

The glass transition temperature of the ester urethane compound is preferably 50° C. or higher. By selecting the type of polyester polyol or diisocyanate in the ester urethane compound and its molecular weight, the glass transition temperature of the ester urethane compound may be adjusted to 50° C. or higher.

The ester urethane compound preferably is anionic. This will further improve the bonding strength. An anionic ester urethane compound may be obtained by copolymerizing a diol or diamine with a sulfonoic acid group or carboxyl group on a side chain during reaction between the polyester polyol and diisocyanate. The ester urethane compound preferably contains sulfonoic acid group or carboxyl group.

The ester urethane compound preferably has an aromatic group containing a benzene ring or the like or a cyclic aliphatic group containing a cyclohexane group or the like.

A mixture of two or more ester urethane compounds may also be used. For example, there may be used a combination of a compound obtained by reacting an aromatic polyester polyol with an aliphatic diisocyanate, and a compound obtained by reacting an aliphatic polyester polyol with an aromatic diisocyanate.

The ester urethane compound preferably has a weight-average molecular weight of 5000 to 100000. If the weight-average molecular weight is less than 5000 the film formability when forming a film will tend to be reduced, and if the weight-average molecular weight is greater than 100000, solubility and compatibility with solvents will be reduced, tending to hamper preparation of coating solutions for film formation.

The ester urethane compound preferably has a radical-polymerizable unsaturated double bond and/or epoxy group. This will allow reaction with the epoxy resin or radical polymerizable compound in the adhesive composition during curing of the circuit-connecting material, for improvement in the elastic modulus and heat resistance of the cured circuit-connecting material.

The circuit-connecting material may also contain a hydroxyl-containing resin in addition to the components explained above. As hydroxyl-containing resins there may be used resins such as polyvinylbutyral, polyvinylformal, polyamides, polyesters, phenol resins, epoxy resins, phenoxy resins, polyurethanes (excluding the aforementioned ester urethane compounds) and the like. Phenoxy resins are particularly preferred among these. Using such hydroxyl-containing resins can further improve the stress relaxation during curing and enhance the adhesive property due to the hydroxyl group.

The weight-average molecular weight of the hydroxyl-containing resin is preferably 10000 or greater and more preferably 10000 to 1000000. If the weight-average molecular weight of the hydroxyl-containing resin is greater than 1000000, miscibility with the other components will tend to be reduced. The glass transition temperature of the hydroxyl-containing resin is preferably −50° C. or higher.

For further enhanced heat resistance, the hydroxyl-containing resin preferably has a radical polymerizing functional group. This will allow the hydroxyl-containing resin to be used as the aforementioned radical polymerizing compound. The hydroxyl-containing resin may also be modified by a carboxyl group-containing elastomer or an epoxy group-containing elastomer.

The circuit-connecting material preferably contains an acryl rubber compound for more excellent stress relaxation. As acryl rubber compounds there may be used polymers or copolymers obtained by polymerization of at least one type of acrylic monomer selected from among acrylic acid, acrylic acid esters, methacrylic acid esters and acrylonitrile. The acryl rubber compound may also be one obtained by copolymerization of the aforementioned monomer with glycidyl acrylate or glycidyl methacrylate. The weight-average molecular weight (weight average) of the acryl rubber compound is preferably 200000 or greater from the viewpoint of increasing the cohesive force of the circuit-connecting material.

The circuit-connecting material may also contain a styrene resin. The styrene resin may be the product of polymerization of a styrene monomer, or it may be a copolymer obtained by copolymerization of styrene with at least one selected from among maleic anhydride and maleimide compounds. The weight-average molecular weight (weight average) of the styrene resin is preferably 100000 or greater from the viewpoint of increasing the cohesive force of the circuit-connecting material.

The circuit-connecting material may also contain fillers, softening agents, accelerators, age inhibitors, coloring agents, flame retardants, thixotropic agents, coupling agents, or phenol resins, melamine resins, isocyanates and the like.

A filler is preferably included to obtain improved connection reliability. The maximum size of the filler is preferably less than the particle size of the conductive particles, and the amount is preferably in the range of 5 to 60 parts by volume (based on 100 parts by volume of the adhesive composition). At greater than 60 parts by volume, the effect of improved reliability may be saturated, and at less than 5 parts by volume the effect of addition will be minimal. Preferred as coupling agents are compounds with vinyl, acrylic, amino, epoxy and isocyanate groups from the standpoint of improving adhesion.

The circuit-connecting material preferably contains conductive particles. Although the circuit members can be connected by direct contact between the circuit electrodes without conductive particles, inclusion of conductive particles can provide more stable connection.

As conductive particles there may be mentioned metal particles such as Au, Ag, Ni, Cu or solder, or carbon particles. In order to sufficiently lengthen the pot life, the conductive particles preferably contain Au, Ag or platinum metal, with Au being more preferred.

Preferably, the conductive particles have nuclei that are particles formed of a transition metal such as Ni or non-conductive glass, ceramic, plastic or the like, which are covered on the surface with a covering layer made of a precious metal such as Au. Conductive particles having such a precious metal covering layer undergo deformation during heating and pressing of the circuit-connecting material, thereby increasing the contact area with the circuit electrodes and further improving reliability. The thickness of the precious metal covering layer is preferably at least 100 angstroms in order to obtain satisfactory connection resistance. Also, when the nuclei are particles consisting of a transition metal such as Ni, the thickness of the covering layer is more preferably at least 300 angstroms. If the thickness of the covering layer is less than 300 angstroms, free radicals will be generated by oxidation-reduction when a portion of the covering layer is lost during dispersion of the conductive particles in the resin, thereby tending to reduce the storage stability of the circuit-connecting material.

The conductive particle content is preferably 0.1 to 30 parts by volume with respect to 100 parts by volume of the adhesive composition. In order to prevent shorting of adjacent circuit electrodes due to excessive conductive particles, the content is more preferably 0.1 to 10 parts by volume.

FIG. 1 is a cross-sectional view showing an embodiment of a circuit-connecting material film according to the invention. The circuit-connecting material film 1 is obtained by forming a film from the circuit-connecting material having multiple conductive particles 5 dispersed in a resin composition layer 3 containing an adhesive composition and an ester urethane compound. The circuit-connecting material film 1 may be fabricated, for example, by coating the circuit-connecting material to a prescribed thickness on a support film. Support films suitable for use include PET films that have been surface treated for releasability.

The circuit-connecting material film 1, when heated and pressed while sandwiched between a pair of opposing circuit members, flows as a melt to electrically connect the circuit electrodes, and is then cured to exhibit adhesive strength. The flow property of the circuit-connecting material film 1 is therefore important. Specifically, when the circuit-connecting material film 1 (thickness: 35 µm, 5 mm×5 mm) is heated and pressed at 150° C., 2 MPa for 10 seconds while sandwiched between two glass panels (thickness: 0.7 mm, 15 mm×15 mm), the value of the flow property index (B)/(A) where (A) is the initial area of the circuit-connecting material film 1 and (B) is the area after heating and pressing, is preferably 1.3 to 3.0 and more preferably 1.5 to 2.5. If the value of (B)/(A) is less than 1.3, the flow property will tend to be insufficient, leading to unsatisfactory connection, and if it is greater than 3.0, bubbles will tend to be generated, lowering the reliability.

Although the circuit-connecting material film 1 described above has only one layer, the circuit-connecting material of the invention may instead be a film formed having a plurality of layers with different compositions. Particularly when the circuit-connecting material contains conductive particles and the adhesive composition in the circuit-connecting material contains a radical initiator that generates radicals in response to heat or light, the circuit-connecting material is preferably a multilayer film separately comprising a layer containing the radical initiator that generates radicals in response to heat or light and the layer comprising conductive particles. This can relates in an even longer pot life.

The circuit-connecting material film 1 may be used for connection between circuit members including, for example, chip parts such as semiconductor chips, resistor chips or condenser chips, or printed boards.

Figure 2:
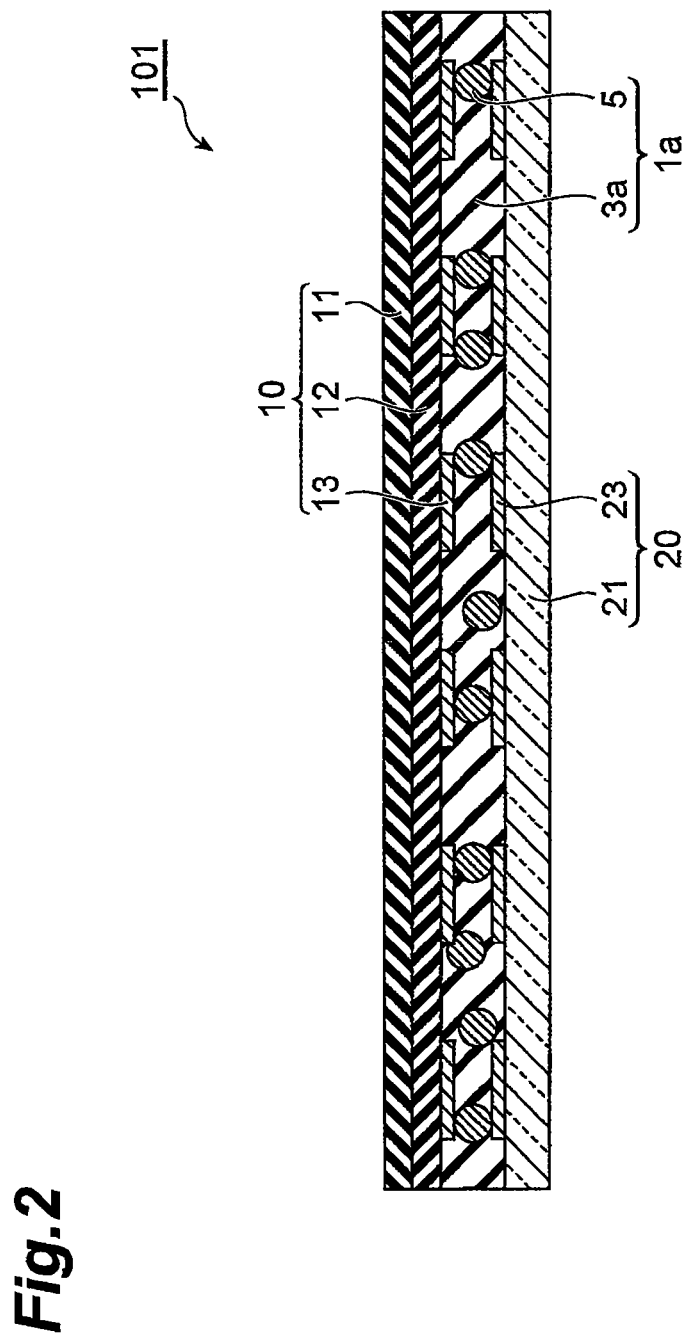
FIG. 2 is a cross-sectional view showing an embodiment of a circuit member connection structure according to the invention.

FIG. 2 is a cross-sectional view showing an embodiment of a circuit member connection structure according to the invention. The circuit member connection structure 101 shown in FIG. 2 comprises a first circuit member 10 with a first board 11 and a first circuit electrode 13 formed on the primary surface thereof via an adhesive layer 12, and a second circuit member 20 with a second board 21 and a second circuit electrode 23 formed on the primary surface thereof, which are connected by a circuit-connecting member 1a made of a cured product of the aforementioned circuit-connecting material, formed between the first and second circuit members 10, 20. In the circuit member connection structure 101, the first circuit electrode 13 and the second circuit electrode 23 are opposing and electrically connected.

The circuit-connecting member 1a is composed of a cured product 3a of a resin composition containing an adhesive composition and an ester urethane compound, and conductive particles 5 dispersed therein. The first circuit electrode 13 and second circuit electrode 23 are electrically connected via the conductive particles 5. The elastic modulus of the circuit-connecting member 1a at 40° C. is preferably 100 to 3000 MPa and more preferably 500 to 2000 MPa.

The first board 11 is a resin film containing at least one type of resin selected from the group consisting of polyethylene terephthalate, polyethersulfone, epoxy resins, acrylic resins and polyimide resins.

The circuit electrode 13 is formed of a material having conductivity sufficient to function as an electrode (preferably at least one selected from the group consisting of gold, silver, tin, platinum-group metals and indium-tin oxide). A plurality of circuit electrodes 13 are bonded to the primary surface of the first board 11 via the adhesive layer 12. The adhesive layer 12 is formed of an adhesive or the like that is ordinarily used for circuit members.

The second board 21 is a glass panel, and a plurality of second circuit electrodes 23 are formed on the primary surface of the second board 21.

The circuit member connection structure 101 may be obtained by a method wherein, for example, the first circuit member 10, the circuit-connecting material film 1 and the second circuit member 20 are heated and pressed as a laminate prepared by laminating them in that order with the first circuit electrode 13 and second circuit electrode 23 opposing each other, to connect the first circuit member 10 and the second circuit member 20 in such a manner that the first circuit electrode 13 and second circuit electrode 23 are electrically connected.

In this method, first the circuit-connecting material film 1 formed on a support film is heated and pressed while attached onto the second circuit member 20 for pre-adhesion of the circuit-connecting material film 1, the support film is released, and then the first circuit member 10 is placed thereon while positioning the circuit electrodes to prepare a laminate.

The heating and pressing conditions for the laminate may be appropriately adjusted depending on the curing property of the adhesive composition in the circuit-connecting material, to obtain sufficient adhesive strength upon curing of the circuit-connecting material.

Figure 3:
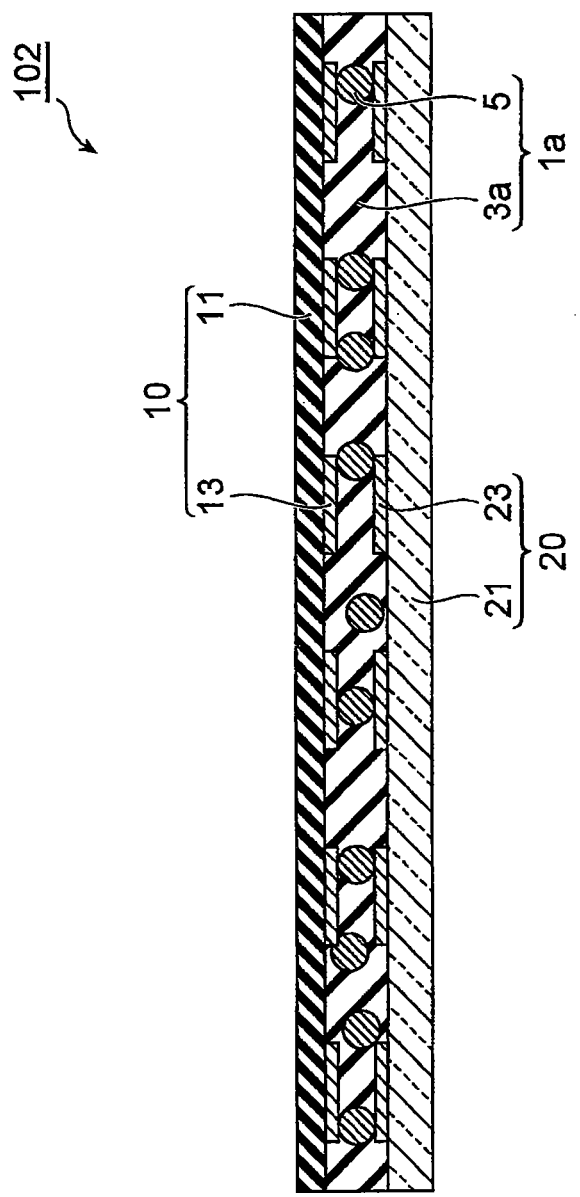
FIG. 3 is a cross-sectional view showing an embodiment of another circuit member connection structure according to the invention.
1 . . . circuit-connecting material film, 1a . . . circuit-connecting member, 5 . . . conductive particle, 10 . . . first circuit member, 11 . . . first board, 12 . . . adhesive layer, 13 . . . first circuit electrode, 20 . . . second circuit member, 21 . . . second board, 23 . . . second circuit electrode, 101 . . . circuit member connection structure, 102 . . . circuit member connection structure.

FIG. 3 is a cross-sectional view showing an embodiment of another circuit member connection structure according to the invention. The circuit member connection structure 102 shown in FIG. 3 is the same as the circuit member connection structure 101, except that the first circuit electrode 13 is directly formed on the primary surface of the first board 11 in the first circuit member 10.

When using a construction wherein the circuit-connecting member 1a is directly bonded with a board formed of a material such as polyethylene terephthalate, polyethersulfone, epoxy resin, acrylic resin, polyimide resin or glass, as in the circuit member connection structure 102, it has been difficult to obtain sufficient bonding strength with conventional circuit-connecting materials. In the circuit member connection structure 102, however, the circuit-connecting member 1a is a cured product of a circuit-connecting material according to the invention, and therefore sufficient bonding strength can be maintained even in high-temperature and high-humidity environments. This effect is also obtained when a layer comprising a polyimide resin, acrylic resin, silicone resin or the like is formed between the circuit-connecting member and the circuit member.

EXAMPLES

The present invention will now be explained in greater detail using examples and comparative examples. However, it is to be understood that the invention is in no way limited to these examples.

Polyester Urethane Resin Preparation Method

A solution of a polyester polyol, obtained by reacting a dicarboxylic acid and a diol, in methyl ethyl ketone was loaded into a heater-furnished stainless steel autoclave equipped with a stirrer, thermometer, condenser, vacuum generator and nitrogen gas introduction tube. Next, a prescribed amount of isocyanate was added, and dibutyltin laurate as a catalyst was added at 0.02 part by weight to 100 parts by weight of the polyester polyol for reaction at 75° C. for 10 hours, followed by cooling to 40° C. piperazine was further added and reaction was carried out for 30 minutes for chain lengthening, followed by neutralization with triethylamine.

After the reaction, the solution was dropped into purified water, upon which the solvent and catalyst dissolved in the water while the polyester urethane resin precipitated as an ester urethane compound. The precipitated polyester urethane resin was dried with a vacuum drier to obtain a polyester urethane resin.

Example 1

Synthesis of polyester urethane resin A

A polyester urethane resin A was obtained by the same procedure as above, using terephthalic acid as the dicarboxylic acid, propylene glycol as the diol and 4,4'-diphenylmethane diisocyanate as the isocyanate, in amounts for a terephthalic acid/propylene glycol/4,4'-diphenylmethane diisocyanate molar ratio of 1.0/1.3/0.25. The weight-average molecular weight of the polyester urethane resin A was measured by gel permeation chromatography to be 27000.

A methyl ethyl ketone solution prepared by dissolving polyester urethane resin A in methyl ethyl ketone to 20 wt % was coated onto a single surface-treated PET film (thickness: 80 μm) using a coating apparatus, and was hot-air dried at 70° C. for 10 minutes to form a film with a thickness of 35 μm. The film was subjected to temperature-dependent measurement of the elastic modulus using a general-purpose dynamic viscoelasticity measuring device under conditions with a pull weight of 5 gf and a frequency of 10 Hz. From the obtained elastic modulus-temperature curve, the glass transition temperature of the polyester urethane resin A was determined to be 105° C., as the temperature at the point of intersection between the line equidistant in the vertical axis direction from lines extended from the baselines before and after the glass transition region and the curve at the step change section of the glass transition region (midpoint glass transition temperature).

Circuit-Connecting Material

There were stirred and mixed together 400 parts by weight of polycaprolactone diol with a weight-average molecular weight of 800, 131 parts by weight of 2-hydroxypropyl acrylate, 0.5 part by weight of dibutyltin dilaurate as a catalyst and 1.0 part by weight of hydroquinone monomethylether as a polymerization inhibitor, while heating at 50° C. Next, 222 parts by weight of isophorone diisocyanate was added dropwise and stirring was continued while heating to 80° C. to promote urethanation reaction. Upon confirming an isocyanate group reaction rate of at least 99%, the temperature was lowered to obtain a urethane acrylate as a radical polymerizing compound.

On the surfaces of particles with polystyrene nuclei there were formed a nickel layer with a thickness of 0.2 μm and a gold layer with a thickness of 0.04 μm in that order to prepare conductive particles with a mean particle size of 10 μm.

Upon mixing 50 g of polyester urethane resin A, 49 g of urethane acrylate resin, 1 g of a phosphoric acid ester acrylate and 5 g of the radical initiator t-hexylperoxy 2-ethylhexanonate, based on solid weight, the conductive particles were added in an amount of 3 vol % of the total and homogeneously dispersed therein to obtain a dispersion for coating. For preparation of the dispersion, the polyester urethane resin A was in the form of a solution dissolved in methyl ethyl ketone at a concentration of 20 wt %, and the t-hexylperoxy 2-ethyl hexanonate was in the form of a 50 wt % DOP solution (trade name, "PERCURE HO" by NOF Corp.), which were mixed with the other components. The obtained dispersion was coated onto a single surface-treated PET film (thickness: 80 μm) using a coating apparatus, and was hot-air dried at 70° C. for 10 minutes to obtain a circuit-connecting material film with a thickness of 20 μm.

Example 2

A polyester urethane resin B was synthesized by the procedure described above, using isophthalic acid, terephthalic acid and adipic acid as dicarboxylic acids, ethylene glycol, neopentyl glycol and 1,6-hexanediol as diols and 4,4'-diphenylmethane diisocyanate as a diisocyanate, in amounts for an isophthalic acid/terephthalic acid/adipic acid/ethylene glycol/neopentyl glycol/1,6-hexanediol/4,4'-diphenylmethane diisocyanate molar ratio of 0.21/0.21/0.58/0.19/0.55/0.46/

0.3. The weight-average molecular weight of the polyester urethane resin B was measured by gel permeation chromatography to be 60000. The glass transition temperature of the polyester urethane resin B was measured in the same manner as Example 1 to be −3° C.

A circuit-connecting material film was fabricated in the same manner as Example 1, except that polyester urethane resin B was used instead of polyester urethane resin A.

Example 3

A circuit-connecting material film was fabricated in the same manner as Example 2, except that 20 g of the 50 g of polyester urethane resin B was replaced with a phenoxy resin (trade name: "PKHC" by Union Carbide Corp., weight-average molecular weight: 45000).

Comparative Example 1

A circuit-connecting material film was fabricated in the same manner as Example 1, except that instead of polyester urethane resin A there was used the polyester polyol used for synthesis of polyester urethane resin A (glass transition temperature: 85° C.).

Comparative Example 2

A circuit-connecting material film was fabricated in the same manner as Example 2, except that instead of polyester urethane resin B there was used the polyester polyol used for synthesis of polyester urethane resin B (glass transition temperature: −5° C.).

Comparative Example 3

A circuit-connecting material film was fabricated in the same manner as Example 3, except that instead of polyester urethane resin B there was used the polyester polyol used for synthesis of polyester urethane resin B (glass transition temperature: −5° C.).

Comparative Example 4

A circuit-connecting material film was fabricated in the same manner as Example 1, except that instead of polyester urethane resin A there was used a polyurethane resin without ester groups (trade name: "PANDEX T-8175" by DIC Bayer Polymer Ltd.) (glass transition temperature: −30° C.).

Fabrication of circuit member connection structure

A circuit member was prepared having 500 chrome circuits (50 μm line width, 100 μm pitch, 0.4 μm thickness) as circuit electrodes formed on a glass panel (trade name "#1737" by Corning, Inc.). The circuit-connecting material film fabricated in Example 1 was attached to the circuit member and pre-adhered thereto by heating and pressing at 70° C., 0.5 MPa for 5 seconds.

Next, the PET film was released, and a flexible circuit member with a trilayer structure (FPC1) prepared by bonding 500 copper circuits (50 μm line width, 100 μm pitch, 18 μm thickness) on a polyimide film (trade name: UPILEX by Ube Industries, Ltd., 75 μm thickness) via an adhesive layer was placed on the circuit-connecting material film and the structure was heated and pressed at 160° C., 3 MPa for 10 seconds. This connected the circuit member with the glass panel and the FPC1 over a 2 mm-wide area.

In the same manner, except for using a flexible circuit board with a bilayer structure (FPC2) prepared by directly forming 500 copper circuits with a 50 μm line width, 100 μm pitch and 8 μm thickness on a polyimide film (trade name: UPILEX 25S by Ube Industries, Ltd., 25 μm thickness) instead of FPC1, the circuit member with a glass panel was connected with FPC2 over a 2 mm-wide area.

FPC1 and FPC2 were each connected to circuit members having glass panels in the same manner as above, using the circuit-connecting material films fabricated in Examples 2 to 3 and Comparative Examples 1 to 4.

Connection Resistance

The resistance values (connection resistance) between opposing circuit electrodes of the fabricated circuit member connection structures were measured using a multimeter. The measurement was conducted initially and after high-temperature and high-humidity treatment by holding for 500 hours in a high-temperature, high-humidity bath at 85° C., 85% RH. Table 1 shows the resistance values, as averages (x+3σ) of 150 resistance value points.

Bonding Strength

The bonding strength of each fabricated circuit member connection structure upon peeling at 90° was measured at a peel speed of 50 mm/min. The measurement was conducted initially and after high-temperature and high-humidity treatment in the same manner as above.

TABLE 1

| | FPC1/glass panel connection sample | | | | FPC2/glass panel connection sample | | | |
|---|---|---|---|---|---|---|---|---|
| | Connection resistance (Ω) | | Bonding strength (N/cm) | | Connection resistance (Ω) | | Bonding strength (N/cm) | |
| | Initial | After high-temp. high-humidity treatment | Initial | After high-temp. high-humidity treatment | Initial | After high-temp. high-humidity treatment | Initial | After high-temp. high-humidity treatment |
| Example 1 | 1.0 | 1.4 | 11.3 | 8.7 | 1.0 | 1.4 | 10.5 | 7.9 |
| Example 2 | 1.4 | 2.3 | 8.9 | 8.8 | 1.4 | 2.3 | 9.1 | 7.5 |
| Example 3 | 1.1 | 1.3 | 9.7 | 7.6 | 1.1 | 1.3 | 10 | 6.5 |
| Comp. Ex. 1 | 0.9 | 1.3 | 4.3 | <2 | 0.9 | 1.3 | 3 | <2 |
| Comp. Ex. 2 | 1.6 | 2.8 | 6.6 | 4.5 | 1.6 | 2.8 | 4.5 | <2 |
| Comp. Ex. 3 | 1.1 | 1.4 | 4.2 | 3.1 | 1.1 | 1.4 | 3.4 | <2 |
| Comp. Ex. 4 | 3.7 | >10 | 8.5 | 8.5 | 3.7 | >10 | 5.2 | <2 |

The circuit member connection structures connected using the circuit-connecting materials of Examples 1 to 3 had sufficiently low initial connection resistance and exhibited high durability with virtually no increase in connection resistance after high-temperature and high-humidity treatment. The durability was particularly superior with Example 1 which employed a polyester urethane resin with a glass transition temperature of 50° C. or greater. With Example 2 which employed a polyester urethane resin with a glass transition temperature of below 50° C., the connection after high-temperature and high-humidity treatment was somewhat loosened and the increase in connection resistance was greater than with Example 1, but it was still within a practically acceptable range. With Example 3 which employed both a polyester urethane resin and a phenoxy resin with a glass transition temperature of 50° C. or greater, the increase in connection resistance after high-temperature and high-humidity treatment was inhibited to about the same level as Example 1.

Examples 1 to 3 maintained bonding strengths of 6 N/cm or greater for both FPC1 and FPC2, initially and after high-temperature and high-humidity treatment. For this test, a bonding strength of 6 N/cm or greater is generally considered to be sufficient for practical use. Comparison of Example 2 and Example 3 shows that Example 2 which had a higher polyester urethane resin content exhibited more excellent bonding strength than Example 3 after high-temperature and high-humidity treatment.

In contrast, Comparative Example 4 which had no ester bond and employed a polyurethane resin with a low glass transition temperature of −30° C. exhibited a large increase in connection resistance after high-temperature and high-humidity treatment. Also, although Comparative Example 4 exhibited relatively good bonding strength with the connection structure using FPC1, it had significantly reduced bonding strength after high-temperature and high-humidity treatment with the connection structure using FPC2. Comparative Examples 1 to 3 all had bonding strengths of about 6 N/cm or less, and therefore failed to exhibit practically sufficient properties at least in terms of bonding strength.

The invention claimed is:

1. A circuit-connecting material for connection between circuit members, wherein each circuit member has a board and a circuit electrode formed on a primary surface of said board, wherein the circuit-connecting material comprises:
    (a) an adhesive composition that cures in response to light or heat; and
    (b) an organic compound containing a urethane group and an ester group, wherein the organic compound is a product of reaction between a polyester polyol and a diisocyanate,
    wherein said polyester polyol is a product of reaction between a diol and a dicarboxylic acid containing an aromatic dicarboxylic acid.

2. A circuit-connecting material according to claim 1, wherein said adhesive composition contains a radical polymerizing compound and a radical initiator that generates radicals in response to heat or light.

3. A circuit-connecting material according to claim 2, wherein said radical polymerizing compound contains a phosphoric acid ester compound with an acrylate group or methacrylate group.

4. A circuit-connecting material according to claim 1, wherein the glass transition temperature of said organic compound is 50° C. or higher.

5. A circuit-connecting material according to claim 1, wherein said organic compound further contains a cyclic aliphatic group.

6. A circuit-connecting material according to claim 1, wherein the weight-average molecular weight of said organic compound is 5000 to 100000.

7. A circuit-connecting material according to claim 1, further comprising conductive particles.

8. A circuit member connection structure comprising:
    a first circuit member comprising a first board and a first circuit electrode formed on a primary surface of said first board; and
    a second circuit member comprising a second board and a second circuit electrode formed on the primary surface of said second board, wherein the first circuit member and the second circuit member are connected by a circuit-connecting member made of a cured product of the circuit-connecting material according to claim 1, wherein the cured product is formed between the first circuit member and the second circuit member so that the first circuit electrode and the second circuit electrode are opposing each other and are electrically connected.

9. A circuit member connection structure according to claim 8, wherein a surface of at least one of said first and second circuit electrodes comprises a material containing at least one substance selected from the group consisting of gold, silver, tin, platinum-group metals and indium tin oxide.

10. A circuit member connection structure according to claim 8, wherein at least one of said first and second boards is a board made of a material comprising one or more components selected from the group consisting of polyethylene terephthalate, polyethersulfone, epoxy resins, acrylic resins, polyimide resins and glass.

11. A circuit member connection structure according to claim 8, wherein a layer comprising one or more resins selected from the group consisting of silicone resins, acrylic resins and polyimide resins is formed between at least one of said first and second circuit members and said circuit-connecting member.

12. A circuit member connection method whereby a first circuit member comprising a first board and a first circuit electrode formed on a primary surface of the first board, a layer made of the circuit-connecting material according to claim 1, and a second circuit member comprising a second board and a second circuit electrode formed on a primary surface of the second board, are heated and pressed as a laminate prepared by laminating components in that order with the said first circuit electrode and the second circuit electrode opposing each other, to connect the first circuit member and the second circuit member so that the first circuit electrode and the second circuit electrode are electrically connected.

13. A circuit member connection method according to claim 12, wherein a surface of at least one of said first and second circuit electrodes comprise a material containing at least one substance selected from the group consisting of gold, silver, tin, platinum-group metals and indium tin oxide.

14. A circuit member connection method according to claim 12, wherein at least one of said first and second boards is a board formed of a material comprising one or more substances selected from the group consisting of polyethylene terephthalate, polyethersulfone, epoxy resins, acrylic resins, polyimide resins and glass.

15. A circuit member connection method according to claim 12, wherein a layer comprising one or more resins selected from the group consisting of silicone resins, acrylic resins and polyimide resins is formed between at least one of said first and second circuit members and the layer made of said circuit-connecting material.

16. A circuit-connecting material according to claim 1, wherein said aromatic dicarboxylic acid contains terephthalic acid or isophthalic acid.

17. A circuit-connecting material according to claim 1, wherein said organic compound has said urethane group and said ester group in the main chain.

18. A circuit-connecting material according to claim 1, wherein said organic compound is anionic.

19. A circuit-connecting material according to claim 1, wherein said diisocyanate contains aromatic, alicyclic or aliphatic diisocyanate.

20. A cured product of a circuit-connecting material according to claim 1, wherein the cured product of the circuit-connecting material electrically connects a first circuit member and a second circuit member, wherein the first circuit member has a first board and a first circuit electrode formed on a primary surface of the first board, and the second circuit member has a second board and a second circuit electrode formed on a primary surface of the second board.

* * * * *